United States Patent
Sonoda et al.

(10) Patent No.: US 6,680,869 B2
(45) Date of Patent: Jan. 20, 2004

(54) SEMICONDUCTOR DEVICE

(75) Inventors: Takahiro Sonoda, Fussa (JP); Takeshi Sakata, Kodaira (JP); Sadayuki Morita, Higashiyamato (JP); Yoshinobu Nakagome, Hamura (JP); Haruko Tadokoro, Higashimurayama (JP); Osamu Nagashima, Hamura (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 32 days.

(21) Appl. No.: 10/120,447

(22) Filed: Apr. 12, 2002

(65) Prior Publication Data

US 2002/0118575 A1 Aug. 29, 2002

Related U.S. Application Data

(63) Continuation of application No. 09/689,664, filed on Oct. 13, 2000, now Pat. No. 6,407,963.

(30) Foreign Application Priority Data

Oct. 19, 1999 (JP) .............................. 11-296269

(51) Int. Cl.⁷ .................................. G11C 7/00
(52) U.S. Cl. ................... 365/189.05; 365/193; 365/233
(58) Field of Search ............... 365/189.05, 191, 365/193, 233

(56) References Cited

U.S. PATENT DOCUMENTS

| | | | |
|---|---|---|---|
| 5,917,772 A | | 6/1999 | Pawlowski ............. 365/189.01 |
| 6,064,625 A | * | 5/2000 | Tomita ........................ 365/233 |
| 6,078,546 A | * | 6/2000 | Lee ............................. 365/233 |
| 6,115,322 A | | 9/2000 | Kanda et al. ........... 365/189.05 |
| 6,151,272 A | * | 11/2000 | La et al. ...................... 365/233 |
| 6,292,428 B1 | | 9/2001 | Tomita et al. ......... 365/189.05 |

\* cited by examiner

*Primary Examiner*—Van Thu Nguyen
(74) *Attorney, Agent, or Firm*—Miles & Stockbridge P.C.

(57) ABSTRACT

A semiconductor memory device of a DDR configuration improved in glitch immunity and the convenience of use is to be provided. It is a dynamic type RAM the operation of whose internal circuit is controlled in synchronism with a clock signal; an input circuit is provided in which a second clock signal inputted when in write operation is used to take in a plurality of write data serially inputted in response to that signal into a plurality of first latch circuits, and said first clock signal is used to take the write data taken into the first latch circuits into the second latch circuit to convey them to an input/output data bus; a logic circuit is provided to mask, in accordance with the logic of the first clock signal and the second clock signal, any noise arising at the end of the second clock signal, and a third clock signal is generated and supplied to the first latch circuits which output the write data to at least the input of the second latch circuits.

2 Claims, 10 Drawing Sheets

SEMICONDUCTOR DEVICE

This application is a continuation of application Ser. No. 09/689,664 filed Oct. 13, 2000 now U.S. Pat. No. 6,407,963.

FIELD OF THE INVENTION

The present invention relates to a semiconductor memory device, and more particularly to a technique which can be effectively utilized in a data input circuit in a synchronous dynamic type random access memory (RAM) of a double data rate (DDR) configuration.

BACKGROUND OF THE INVENTION

According to the specifications of the data input system in a double data rate synchronous dynamic random access memory (DDR SDRAM), write data are entered in synchronism with an edge of a data strobe signal DQS as illustrated in FIG. 8, not with a clock signal for controlling the timing of the whole SDRAM. In other words, when a write command (WRITE) is entered at the rise timing of the clock signal CLK, the DQS once shifts from a high impedance state to a low level for a period tWPRE (PREAMBLE).

After that, a data strobe signal DQS which varies from a clock CLK matching the write command from a low level to a high level at a timing defined by a time length tDQSS is entered and, in response to the variations of this signal DSQ from the low level to the high level and from the high level to the low level, input data D0 through D4 and the like, whose set-up/hold time (tQDQSS/tQDQSH) is secured, are entered. The time length tDQSS is defined in a range of 0.75 tCK to 1.25 tCK. Upon entry of input data equivalent to a desired data length (D0 through D3 in the chart), the clock signal DQS takes on a low level (POSTAMBLE) during a time length tWPST, and again returns to a high impedance state.

Before this invention, the present inventors had developed an input circuit matching the specifications of the aforementioned data input system, as illustrated in FIG. 9. In this circuit, a three-stage shift register and a two stage shift register are configured by combining through-latch circuits operated by the clock signal DQS, wherein the data D0 and D2 are transferred by the three-stage shift register in synchronism with the rising edge of the clock signal DQS, while the data D1 and D3 are transferred by the two-stage shift register in synchronism with the falling edge of the clock signal DQS, converted in parallel into two sequences of input data, DIN1 and DIN2, and entered into a pair of latch circuits which take in input signals with a clock signal CLK to change the timing between DQS and CLK, and a selected memory cell in a memory array is cause to make a write action in synchronism with this clock signal CLK.

However, this input circuit was found to entail the following problem. Thus, as shown in FIG. 10, if the time length tDQSS defined by the clock CLK matching the write command is as short as 0.75 tCK, when data equivalent to a desired data are entered, the clock signal DQS returns to a high impedance state before a clock signal DCLK formed in synchronism with the clock signal CLK arrives, and noise known as glitch may arise in an output circuit generating the clock signal DQS when an input terminal into which the clock signal DQS is inputted returns to the high impedance state. The input circuit would mistake this noise for the clock signal DQS and generate a shift clock, which causes the shift registers to perform a one-bit shifting action. This has been found to give rise to a problem that this shifting action crosses out the data which should be held, and invalid data (INVALID) are taken in as write data at the timing of a clock signal DICLK, which is mounted with a time lag.

An object of the present invention is to provide a semiconductor memory device for enhanced DQS-glitch immunity. Another object of the invention is to semiconductor memory device of a DDR configuration, which is more convenient to use.

SUMMARY OF THE INVENTION

Typical ones of the aspects of the invention disclosed in this application will be described below. According to one aspect of the invention, there is provided a dynamic type random access memory (RAM) the operation of whose internal circuits is controlled in synchronism with a clock signal, provided with an input circuit which, using a second clock signal entered when in a write operation, successively takes a plurality of sets of write data serially entered matching the second clock signal into a plurality of first latch circuits, and takes the write data taken into the first latch circuits into a second latch circuit by using the second clock signal to convey them into an input/output data bus, wherein a logic circuit is provided for masking any noise arising at the end of the second clock signal according the logic of the first clock signal and the second clock signal to generate a third clock signal, which is supplied to a first latch circuit for outputting the write data to at least the input of the second latch circuit.

BRIEF DESCRIPTION OF THE DRAWINGS

These and other objects and novel features of the present invention will become more apparent from the following detailed description when taken in conjunction with the accompanying drawings, wherein.

DETAILED DESCRIPTION OF THE PREFERRED EMBODIMENTS

Figure 7:
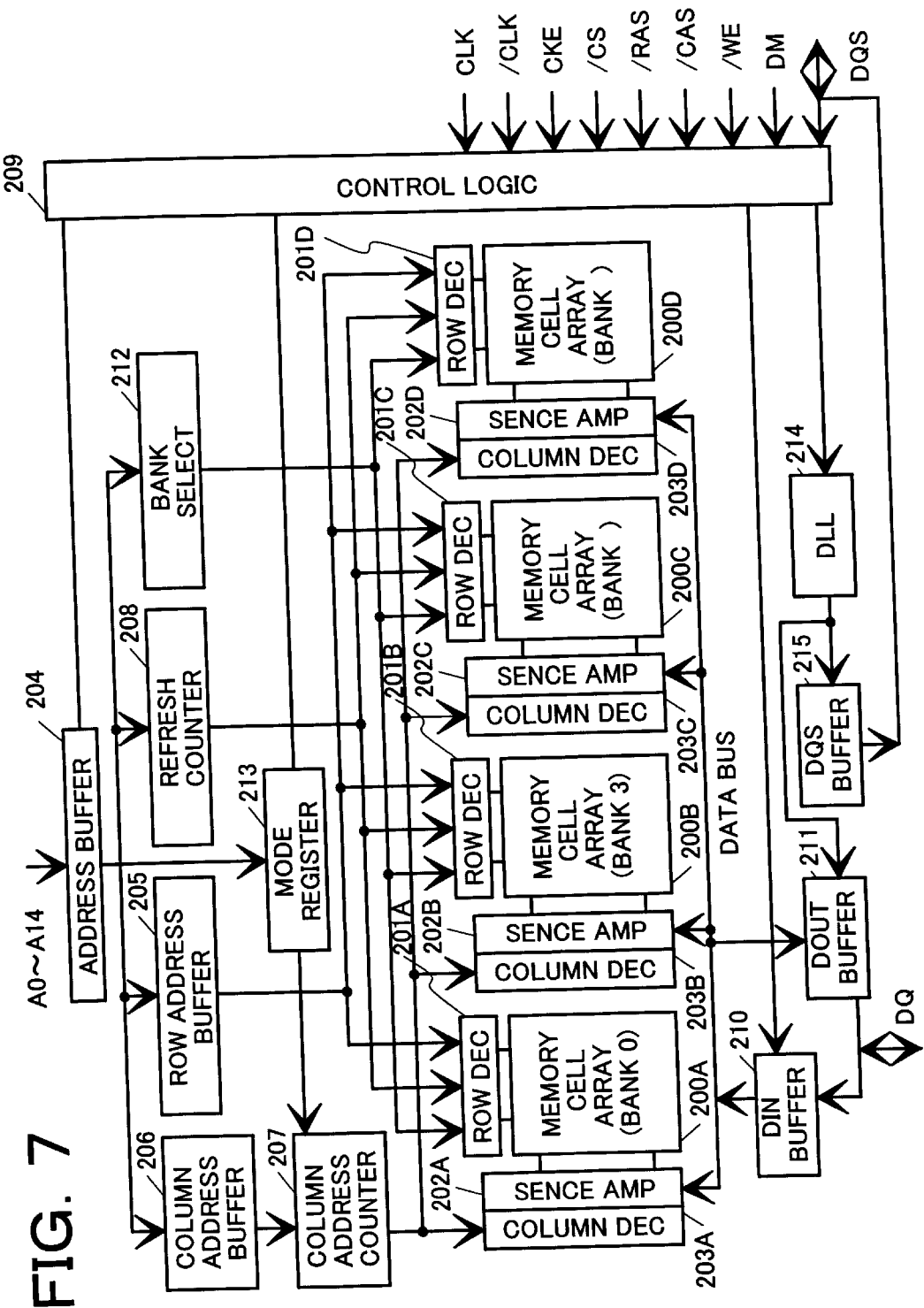
FIG. 7 is a block diagram illustrating one example of dynamic type RAM pertaining to the invention.

FIG. 7 is a block diagram illustrating one example of dynamic type RAM pertaining to the invention. The dynamic type RAM in this example is to be used as a double data rate synchronous dynamic random access memory (DDR SDRAM). The DDR SDRAM in this example has four memory arrays 200A through 200D matching four memory banks, though its configuration is not limited to this. Each of the memory array 200A through 200D respectively matching the four memory banks 0 through 3 has dynamic type memory cells arranged in a matrix. As shown in this diagram, the selection terminal for memory cells arranged in the same column are coupled to a word line (not shown) for each column, and the data input/output terminal for memory cells arranged on the same row are coupled to a complementary data line (not shown).

One of word lines (not shown) of the memory array 200A is driven to a selection level according to the result of decoding of a row address signal by a row decoder (ROW DEC) 201A. Complementary data lines (not shown) of the memory array 200A are coupled to the I/O lines of a sense amplifier (SENSE AMP) 202A and a column decoder (COLUMN DEC) 203A. The sense amplifier 202A is an amplifying circuit for detecting and amplifying minute potential differences emerging on the respective complementary data lines as data are read out of memory cells. A column selection circuit 203A therein includes a switching circuit for individually selecting the complementary data lines and establishing their continuity to the complementary I/O lines. The column switching circuit is selectively operated according to the result of decoding of a column address signal by the column decoder 203A.

The memory arrays 200B through 200D are similarly provided with row decoders 200B through 200D, sense amplifiers 203B through 203D and column selection circuits 203B through 203D, respectively. The complementary I/O lines are made common for every memory bank, and connected to the output terminal of a data input circuit (DIN BUFFER) 210 having a write buffer and the input terminal of a data output circuit (DOUT BUFFER) 211 including a main amplifier. A terminal DQ is a data input/output terminal for inputting or outputting data D0–D15 consisting of 16 bits, though not necessarily limited to that. A DQS buffer (DQS BUFFER) 215 generates the data strobe signal of data to be outputted from the terminal DQ in read operation.

Address signals A0 through A14 supplied from an address input terminal are once held by an address buffer (ADDRESS BUFFER) 204 and, out of the address signals inputted in a time series, row-related address signals are held by a row address buffer (ROW ADDRESS BUFFER) 205, while column-related address signals are held by a column address buffer (COLUMN ADDRESS BUFFER) 206. A refresh counter (REFERESH COUNTER) 208 generates row addresses at the time of automatic refreshing and self-refreshing.

For instance, where the storage capacity is 256 megabits, if the memory is to be accessed in 2-bit units, an address terminal to which the address signal A14 as the column address signal is to be inputted is provided. In a configuration for 4-bit units, signals up to the address signal A11 are deemed valid; in a configuration for 8-bit units, signals up to the address signal A10 are deemed valid; and in a configuration for 16 four-bit units, signals up to the address signal A9 are deemed valid. Where the storage capacity is as large as 64 megabits, in a configuration for 4-bit units, signals up to the address signal A10 are deemed valid, signals up to the address signal A9 are deemed valid; and in a configuration for 16 four-bit units, signals up to the address signal A8 are deemed valid.

The output of the column address buffer 206 is supplied as preset data of a column address counter (COLUMN ADDRESS COUNTER) 207, and the column address counter 207, in a burst mode designated by a command or the like to be described below, outputs to the column decoders 203A through 203D a column address signal as the preset data or values resulting from successive incremental addition of the column address signal.

A mode register (MODE REGISTER) 213 holds various items of operational mode information. Of row decoders (ROW DECODER) 201A through 201D, only what matches the bank designated by a bank select (BANK SELECT) circuit 212 operates to select a word line. A control logic (CONTROL LOGIC) 209 is supplied to external control signals including, but not necessarily limited to clock signals CLK and /CLK (sign / means that the signal marked with it is a row enable signal), a clock enable signal CKE, chip select signal /CS, a column address strobe signal /CAS, a row address strobe signal /RAS, and a write enable signal /WE, /DM, DQS and an address signal via the mode register 213, and generates internal timing signals for controlling the operating mode of the DDR SDRAM and the circuit block on the basis of level variations and timings of those signals, an input buffer being provided corresponding to each signal.

The clock signals CLK and /CLK are entered into a DLL circuit 214 via a clock buffer, and an internal clock is generated. The internal clock is used as an input signal to the data output circuit 211 and the DQS buffer 215, though not necessarily limited to these purposes. The clock signals via the clock buffer are also supplied to the data input circuit 210 and the clock terminal of the column address counter 207.

Other external input signals are made significant in synchronism with the rising edge of each pertinent internal clock signal. The chip select signal /CS with its low level instructs the start of a command input cycle. When the chip select signal /CS is at its high level (a state of no chip being selected), no other input is significant, though a memory bank selected state to be described afterwards and internal operations including a burst operation are not affected by a change to the state of no chip being selected. The signals /RAS, CAS and /WE functionally differ from corresponding signals in a usual DRAM, and become significant signals when defining the command cycle to be described later.

The clock enable signal CKE is a signal indicating the validity of the next clock signal. If the pertinent signal CKE is at its high level, the rising edge of the next clock signal CLK is validated, or when it is at its low level, the edge is invalidated. Incidentally, if an external control signal /OE to control the output enable over the data output circuit 211 in the read mode, this signal /OE is also supplied to control logic 209 and, if the signal is at its high level for instance, the data output circuit 211 is placed in a high output impedance state.

The row address signal is defined by the levels of A0 through A11 in a row address strobe bank active command cycle, to be described below, synchronized with the rising edge of the clock signal CLK (internal clock signal).

The address signals A12 and A13 are deemed to be bank selection signals in the row address strobe bank active command cycle. Thus one of the four memory banks 0 through 3 is selected according to the combination of A12 and A13. Control on memory bank selection can be accomplished by one of such actions including, but not necessarily limited, to the activation of only a row decoder on the selected memory bank side, total non-selection of column switching circuits on the non-selected memory bank side or connection of only the selected memory bank side to the data input circuit 210 and the data output circuit.

The column address signal, when in a 256 megabits×16 bits configuration as stated above, is defined by the levels of A0 through A9 in a read or write command (column address read command and column address write command to be described later) cycle synchronized with the rising edge of the clock signal CLK (internal clock). The column address so defined is used as the start address of a burst access.

Next will be described main operating modes of SDRAM indicated by a command.

(1) Mode Register Set Command (Mo)

This is a command for setting the mode register 30, designated by the low level of /CS, /RAS, /CAS and /WE, and the data to be set (register set data) are give via A0 through A11. The register set data are to be in one of the mode including, but not necessarily limited to, burst length, CAS latency and write mode. The burst length that can be set is 2, 4 or 8; the CAS latency that can be set is 2 or 2.5; and the write mode that can be set is the burst write or single write mode.

The CAS latency is to indicate how many cycles of internal clock signals are spent in a read operation indicated by a column address read command, to be described below, from the falling edge of /CAS until the output operation of the output buffer 211. This indication is intended to set, according to the frequency used by the internal clock signals, the length of time taken by internal operations for data reading until the data to be read are made definite. In other words, where internal clock signals of a high frequency are used, the CAS latency is set to a relatively large value, while internal clock signals of a low frequency are used, the CAS latency is set to a relatively small value.

(2) Row Address Strobe and Bank Active Command (Ac)

This is a command for indicating a row address strobe and invalidating the selection of the memory bank according to A12 and A13. It is designated by the low level of /CS and /RAS and the high level of /CAS and /WE, and the address then supplied to A0 through A9 is taken in as the row address signal and the signal supplied to A12 and A13, as the memory bank selection signal. The taking-in operation is accomplished in synchronism with the rising edge of the internal clock signal. For instance, upon designation of the command, word lines in the memory bank thereby designated are selected, and the memory cells connected to the word lines are made continuous to the respectively corresponding complementary data line.

(3) Column Address Read Command (Re)

This command is a command required for starting burst read operation as well as a command to indicate a column address strobe. It is indicated by the low level of /CS and /CAS and the high level of /RAS and /WE, and the column address then supplied to A0 through A9 (in the case of a ×16-bit configuration) is taken in as the column address signal. The column address signal thereby taken in is supplied to the column address counter 207 as the burst start address.

In the burst read operation there by instructed, as the selection of the memory banks and of the word lines therein is accomplished in the address strobe bank active command cycle before that, the memory cells of the selected word lines are successively selected in accordance with address signals outputted from the column address counter 207 in synchronism with the internal clock signal, and the data therein are consecutively read out. The number of sets of data so read out is designated with the burst length. The start of data reading from the output buffer 211 is carried out awaiting the number of cycles of the internal clock signal specified by the CAS latency.

(4) Column Address Write Command (Wr)

This command is indicated by the low level of /CS, /CAS and /WE and the high level of /RAS. The address then supplied to A0 through A9 is taken in as the column address signal. The column address signal thereby taken in is, when in burst write, supplied to the column address counter 207 as the burst start address. The procedure of the burst write operation thereby instructed is accomplished in the same manner as the burst read operation, though write operation has no CAS latency, and the write data begin to be taken in one clock after the pertinent column address write command cycle.

(5) Pre-charge Command (Pr)

This is a start command for pre-charge operation upon the memory banks selected according to A12 and A13, and indicated by the low level of /CS, /RAS and /WE and the high level of /CAS.

(6) Auto-refresh Command

This is a command required for starting auto-refreshment, and is indicated by the low level of /CS, RAS and /CAS and the high level of /WE and CKE.

(7) Non-operation Command (Nop)

This is a command to instruct not to perform any substantial operation, and is indicated by the low level of /CS and the high level of /RAS, /CAS and /WE.

In the DDR SDRAM, when burst operation is taking place in one memory bank, if a row address strobe and bank active command designating another memory bank is supplied, row address-related operation in that additionally designated memory bank is enabled without affecting the operation in that already active memory bank.

Therefore, unless data D0 through D15 conflict with one another at a data input/output terminal consisting of 16 bits for instance, it is possible, during the execution of a command whose processing has not ended, to start internal operations in advance by issuing a pre-charge command, and a row address strobe and bank active command on a memory bank different from the memory bank in which the command currently under execution is to be processed. In the DDR SDRAM of this embodiment, memories are accessed in 16-bit units as stated above, it has about 4M A0 through A11 addresses and is configured of four memory banks, resulting in an overall storage capacity of about 256 megabits (4M×4 banks×16 bits).

Details of operation to read out of the DDR SDRAM are as follows. The chip select /CS, /RAS, /CAS and write enable /WE signals are entered in synchronism with the CLK signal. Upon /RAS=0, the row address and bank selection signals are entered, and held by the row address buffer 205 and the bank selecting circuit 212, respectively. The row decoder 210 of the bank designated by the bank selecting circuit 212 decodes the row address signal, and data of the whole row are outputted from a memory cell array 200 as a minute signal. The outputted minute signal is amplified and held by the sense amplifier 202. The designated bank is activated.

Three CLKs after the inputting of the row address, upon CAS=0, the column address and bank selection signals are inputted, and held by the column address buffer 206 and a bank select circuit 212, respectively. If the designated bank is active, the held column address is outputted from the column address counter 207, and the column decoder 203 selects a column. The selected data are outputted from the sense amplifier 202. The data then outputted are an equivalent of two sets (8 bits in ×4-bit configuration or 32 bits in ×16-bit configuration)

The data outputted from the sense amplifier 202 are further outputted from the output circuit 211 via a data bus DataBus to outside the chip. The output timing is synchronized with the rising and falling edges of QCLK outputted from the DLL circuit 214. Then, the aforementioned data equivalent to two sets are subjected to parallel-to-serial conversion to become one set of data×2. Upon outputting of the data, the data strobe signal DQS is outputted from the DQS buffer 215. If the burst length stored in the mode register 213 is four or more, the column address counter 207 automatically increments the address to read out the next column data.

The role of the DLL 214 is as follows. In the data output circuit 211 and the DQS buffer 215 generating the operation clock for the data output circuit 211 and the DQS buffer 215, some time is taken after the internal clock signal generated by the DLL 214 is inputted until the data signal and the data strobe signal are actually outputted. For this reason, by using a suitable replica circuit to advance the phase of the internal clock signal ahead of the external CLK, the phases of the data signal and of the data strobe signal are made identical with that of the external clock CLK. Therefore, the DQS buffer is kept in a high output impedance state except during the data output operation such as described above.

When in write operation, as the DQS buffer 215 of the DDR SDRAM in a high output impedance state, the data strobe signal DQS is inputted to the terminal DQS from a data processor such as a microprocessor, and write data synchronized with it inputted to the terminal DQ. The data input circuit 210 takes in, serially as stated above, the write data inputted from the terminal DQ in accordance with the clock signal formed on the basis of the data strobe signal inputted from the terminal DQS, converts them into parallel data in synchronism with the clock signal CLK. The data are conveyed via the data bus to the selected memory banks, and written into the selected memory cells of the memory banks. In this write operation, in order to prevent the data input circuit 210 from being caused to erroneously operate by noise known as glitch in the terminal DQS as described above, the glitch masking function is added.

Figure 1:
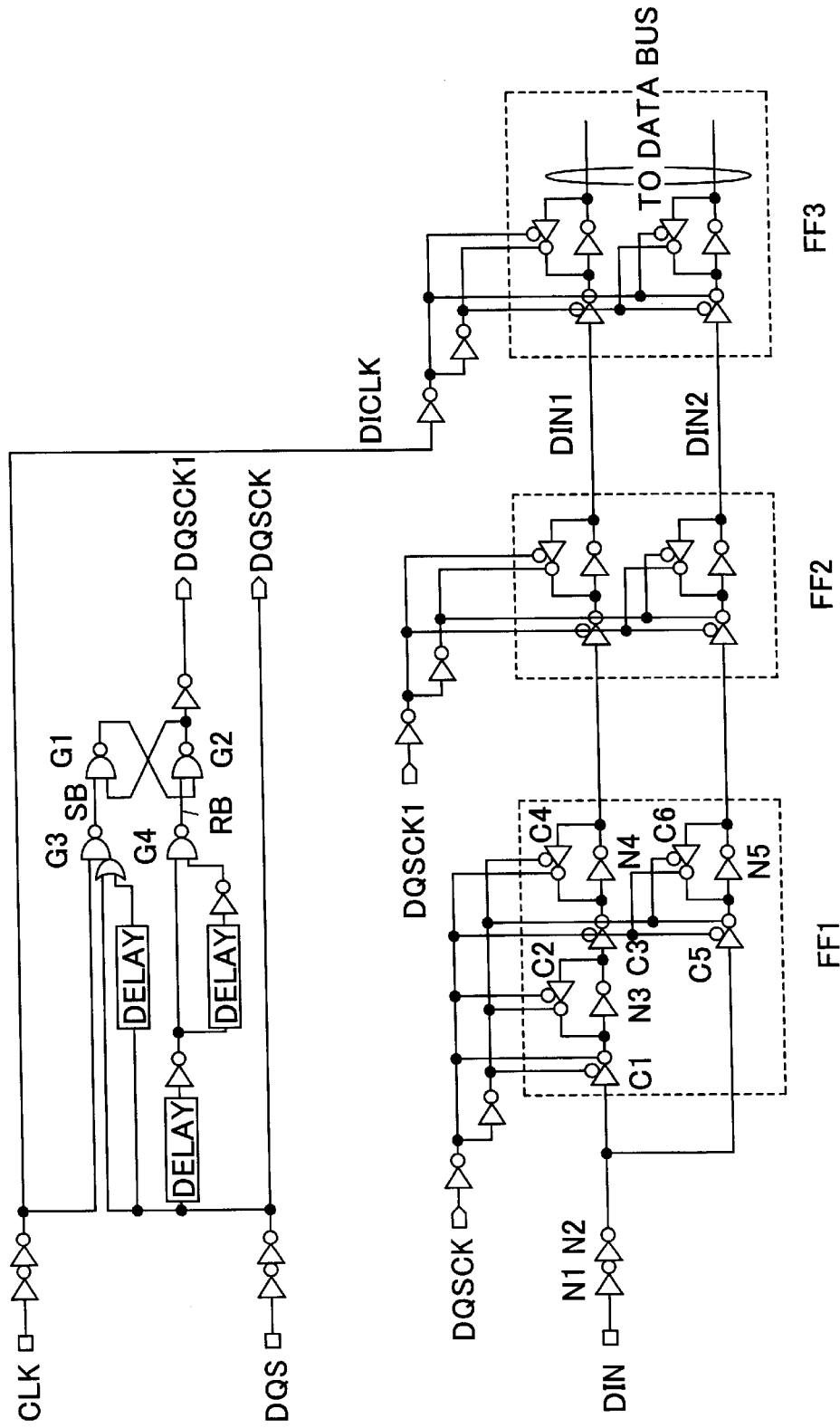
FIG. 1 is a circuit diagram illustrating a data input circuit and its clock generating circuit in one embodiment of the invention.

FIG. 1 s a circuit diagram illustrating a data input circuit and its clock generating circuit in one embodiment of the present invention. The data input circuit is configured of a data input buffer, a flip-flop circuit FF1 of the input section, a flip-flop circuit FF2 of the output section and a flip-flop circuit FF3 for taking in write data. The flip-flop circuits FF1 and FF2 are operate in accordance with the data strobe signal DQS, while the flip-flop circuit FF3 is operated in accordance with the clock signal CLK used for controlling the whole SDRAM chip to cause the write data to change the timing between DQS and CLK.

The write data inputted from an external terminal DIN are converted into internal signals by an input buffer consisting of inverter circuits N1 and N2 connected in two cascade stages. The flip-flop circuit FF1 of the input section is configured of three through-latch circuits operated according to the clock signal DQSCK for taking in the input. One of the through-latch circuit is composed of an input side clocked inverter circuit C1, the inverter circuit N3 and a clocked inverter circuit C2 for feedback, provided between the input and the output of this inverter circuit. The two other through-latch circuits also consist of clocked inverter circuits C3 and C4 and an inverter circuit N4, and clocked inverter circuits C5 and C6 and an inverter circuit N5, all similar to their respective counterparts in the first through-latch circuit.

The through-latch circuit C1, C2 and N3 and the through-latch circuit C3, C4 and N4 are connected in cascade. Of these, the input side through-latch circuits and the remaining one through-latch circuit C5, C6 and N5 are supplied with internal signals generated by the input buffer. In the through-latch circuit (C1, C2 and N3) on the fore stage side of the through-latch circuits connected in two cascade stages, when the clock signal DQSCK is at its low level, the clocked inverter circuit C1 on the input side enters into an operating state and the clocked inverter circuit C2 on the feedback side enters into a high output impedance state to let the input signal through.

Conversely in the through-latch circuit (C3, C4 and N4) on the aft stage side of the through-latch circuits connected in two cascade stages, when the clock signal DQSCK is at its high level, the clocked inverter circuit C3 on the input side enters into an operating state and the clocked inverter circuit C4 on the feedback side enters into a high output impedance state to let the input signal through. Thus, when the clock signal DQSCK is at its high level, the clocked inverter circuit C3 on the input side enters into an operating state and the clocked inverter circuit C4 on the feedback side enters into a high output impedance state, holding the input signal which was let through before that. Therefore, when the input side through-latch circuit is letting an input signal through, the output side through-latch circuit is holding the input signal taken in before. This results in one-bit shift operation by the high level and the low level of the clock signal DQSCK.

In the remaining one through-latch circuit (C5, C6 and N5), as in the aft stage through-latch circuit (C3, C4 and N4), when the clock signal DQSCK is at its high level, the clocked inverter circuit C5 on the input side enters into an operating state and the clocked inverter circuit C6 on the feedback side enters into a high output impedance state to let the input signal through. Thus, when the clock signal DQSCK drops from its high level and the through-latch circuit (C1, C2 and N3) is letting the input signal through, the clocked inverter circuit C5 on the input side enters into a high output impedance state and the clocked inverter circuit C6 on the feedback side enters into an operating state, holding the input signal which was let through before that.

As a result, a first set of data D0 serially inputted in synchronism with the clock signal DQSCK are taken into the through-latch circuit (C1, C2 and N3) at the timing of the variation of the clock signal DQSCK from the low level to the high level, and transferred to the through-latch circuit (C3, C4 and N4) at the timing of the variation of the clock signal DQSCK from the high level to the low level, with a second set of data inputted at this timing being taken into the through-latch circuit (C5, C6 and N5) at the same time. As a result, two-bit serial data are taken in as parallel data. Thereafter, similarly, any write data serially inputted are converted into parallel data and taken in at the timing described above.

Figure 8:
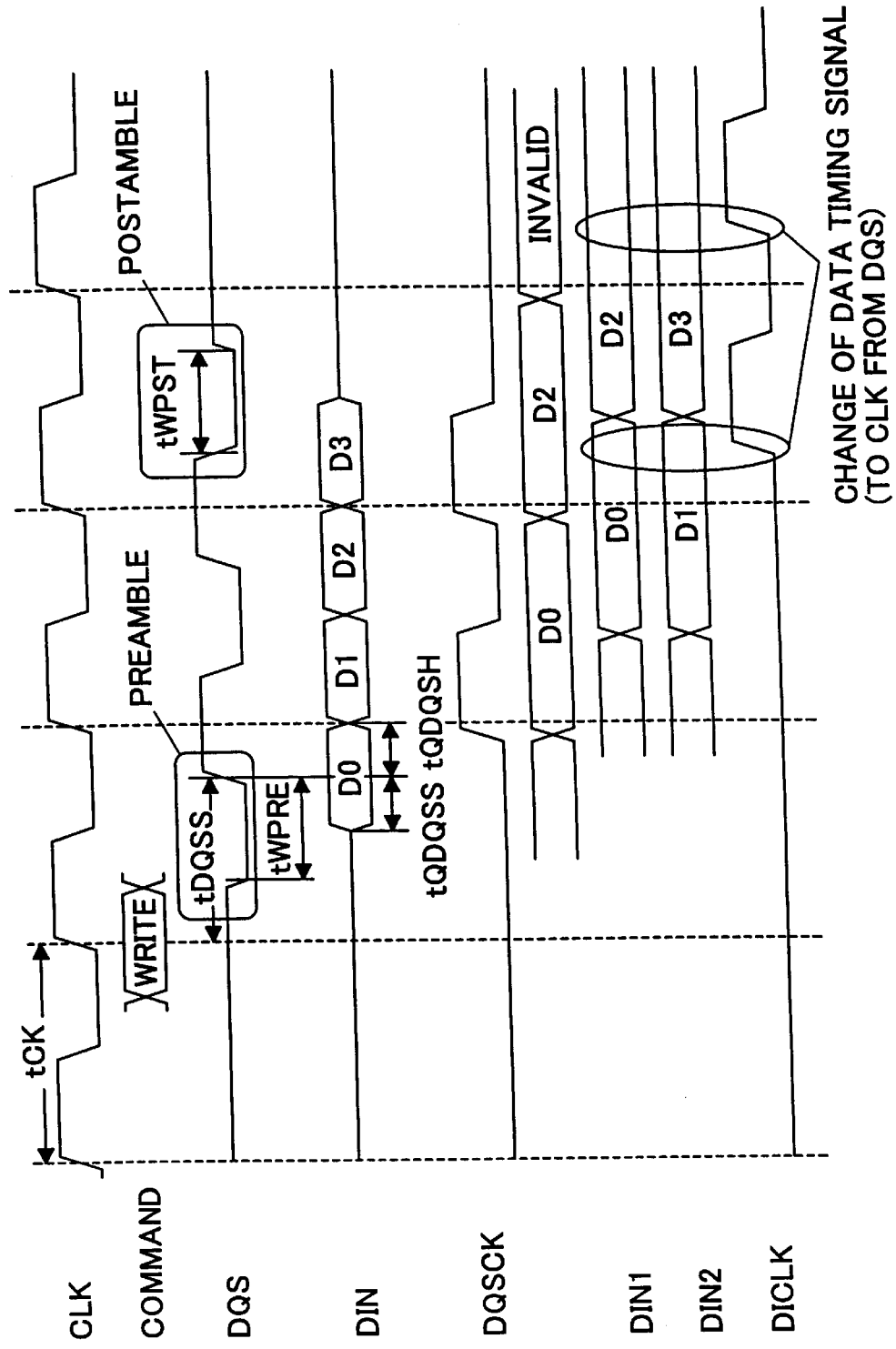
FIG. 8 is a timing chart for explaining one example of the write operation of a DDR SDRAM.
Figure 9:
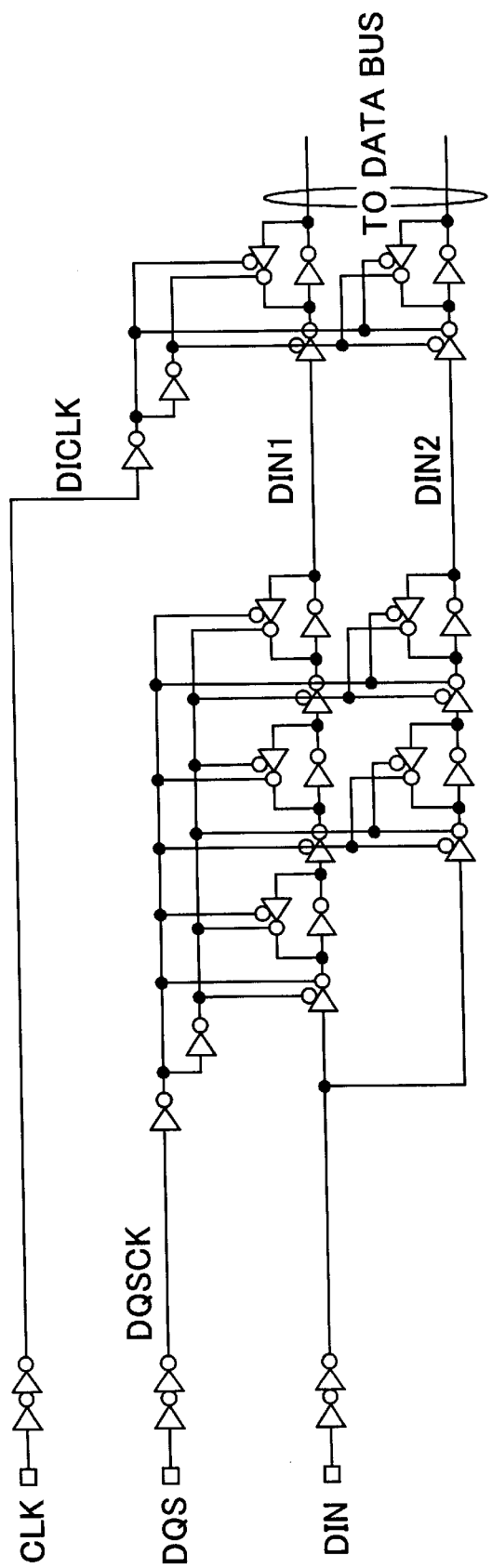
FIG. 9 is a circuit diagram of a data input circuit studied prior to the invention.
Figure 10:
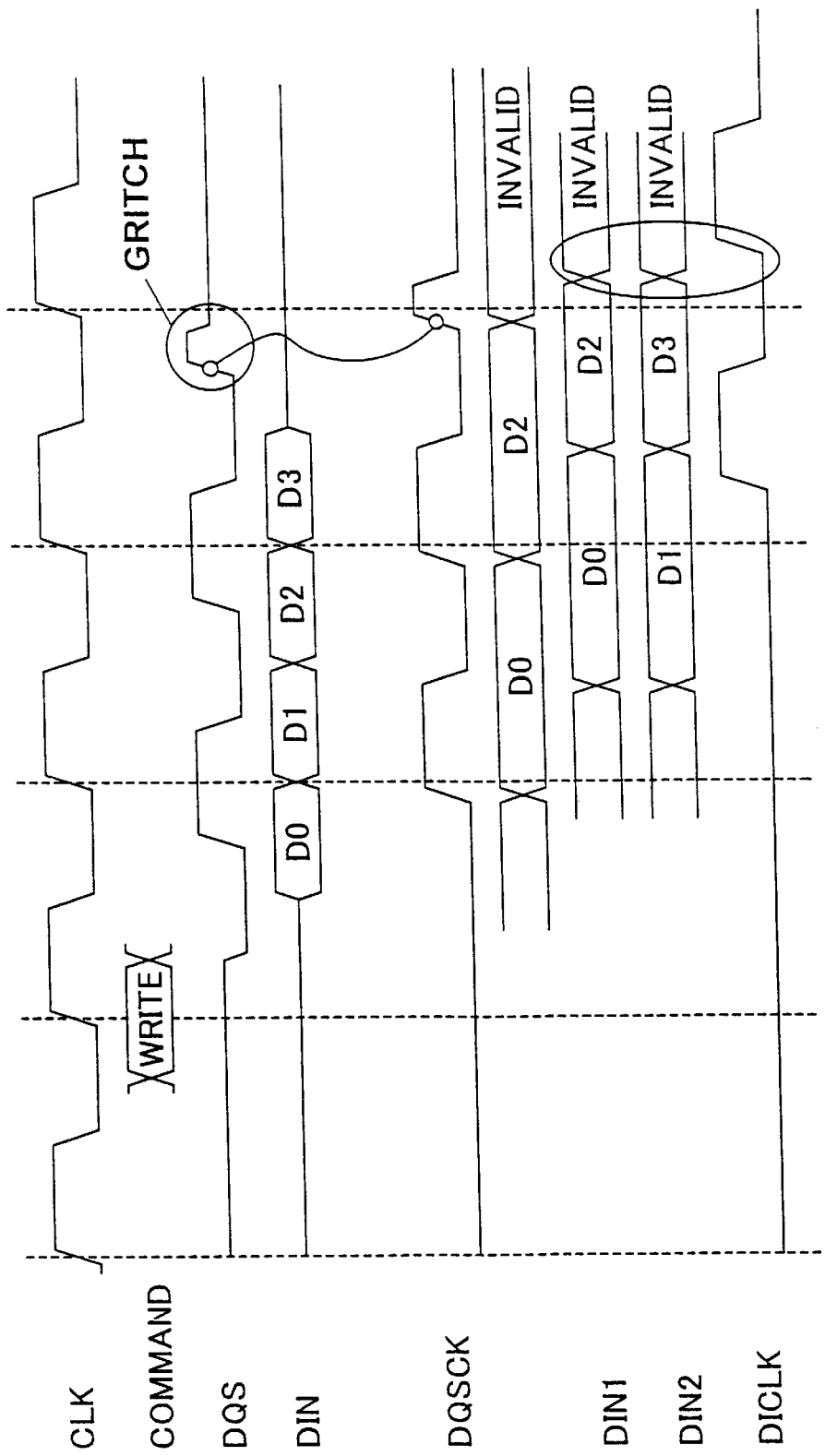
FIG. 10 is a timing chart for explaining the operation of the data input circuit illustrated in FIG. 9.

Each of the flip-flop circuits FF2 and FF3 is configured of a pair of through-latch circuits to match the two-bit data converted into parallel data. In this embodiment, as the clock signal for controlling the operation of the flip-flop circuit FF2, instead of using the same clock signal DQSCK as that for the flip-flop circuit FF1 for the conversion of input signals into parallel data as shown in FIG. 8, a clock signal DQSCK1 generated by a clock generating circuit to which the glitch masking function, to be described below, is used. The flip-flop circuit FF3 is operated with a clock signal DICLK matching the clock signal CLK in the same way as described above, and a change from the clock matching the data strobe signal DQS to the clock signal CLK used for controlling the whole chip is caused to take place as stated above.

The clock generating circuit, with the clock signal CLK and DQS as its inputs, generates the clock signals DQSCK, DQSCK1 and DICLK. Of these, the clock signal DQSCK is a signal matching the data strobe signal DQS, and the clock signal DICLK also matches the clock signal CLK. Thus, as the clock signal DQSCK, a signal having passed the input buffer receiving the data strobe signal DQS supplied from the external terminal is used as it is, and as the clock signal DICLK, a signal having passed the input buffer receiving the clock signal CLK supplied from the external terminal is used as it is.

The clock signal DQSCK1 is generated by the logic circuit which realizes a masking function to prevent any substantial response to glitch. In this embodiment, a set/reset flip-flop circuit is configured of NAND gate circuits G1 and G2, and by adding the aforementioned condition of the clock signal CLK to a set input signal SB to the flip-flop circuit, the clock signal DQSCK1 which does not substantially respond to glitch is generated.

To the input of the NAND gate circuit G3 for generating the set input signal SB are supplied the clock signal CLK and the data strobe signal DQ. For timing adjustment, a delayed signal may be used as the data strobe signal DQS. As the reset input signal RB for the flip-flop circuit, a one-shot pulse generated in the following way is used: an inverted and delayed signal is generated by a delay circuit and an inverter circuit, and this signal and a signal resulting from further inversion and delaying of this signal is inputted to a NAND gate circuit G4, and the one-shot pulse is generated when the data strobe signal DQS varies from the high level to the low level. Incidentally, the delay circuit and an OR gate circuit for generating a signal resulting from the delaying of the data strobe signal DQS to generate the set input signal SB may be dispensed with.

Figure 2:
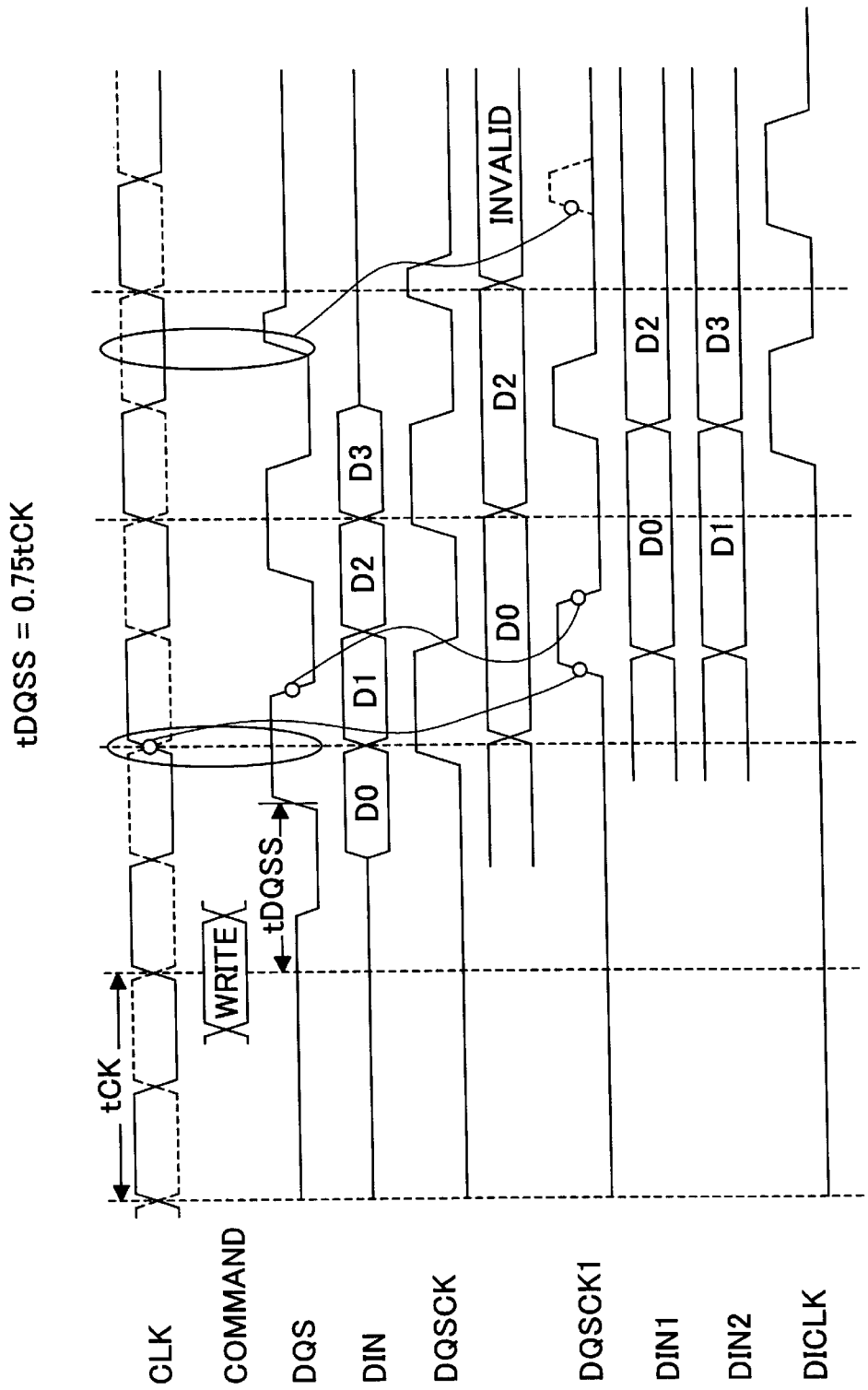
FIG. 2 is a timing chart for explaining one example of the operation of the data input circuit.

FIG. 2 is a timing chart for explaining one example of the operation of the data input circuit. The chart shows the operation that takes place when the length of time tDQSS from the command input until the inputting of the first data strobe signal DQS is at the permissible minimum of 0.75 tCK. When the data strobe signal DQS is inputted ahead of the clock signal CLK, the clock signal DQSCK1, as the data strobe signal DQS rises to the high level earlier, varies from the low level to the high level correspondingly to the timing of the variation of the clock signal CLK from the low level to the high level, and the first set of data D0 and the second set of data D1 are taken into the flip-flop circuit FF2. And after transferring the data taken in according to the clock signal DICLK generated in response to the clock signal CLK to the flip-flop circuit FF3, the third set of data D2 and the fourth set of data D3 are taken in at the timing of the variation of the clock signal DQSCK1 from the low level to the high level.

In a state wherein the flip-flop circuit FF2 has taken in the sets of data D2 and D3 in response to the variation of the clock signal DQSCK1 from the high level to the low level, before transferring the sets of data D2 and D3 to the flip-flop circuit FF3, in other words before the clock signal DICLK varies from the low level to the high level, even if noise known as glitch arises when the data strobe signal DQS returns to a high impedance, the set signal SB for the flip-flop circuit of the clock generating circuit is not generated because the clock signal CLK is reduced to the low level by that time. Therefore, since no clock signal DQSCK1 which would cause the flip-flop circuit FF2 to take in data is not generated, the sets of data D2 and D3 remain to be held, and taken into the flip-flop circuit FF3 as write data in response to the clock signal DICLK.

Figure 3:
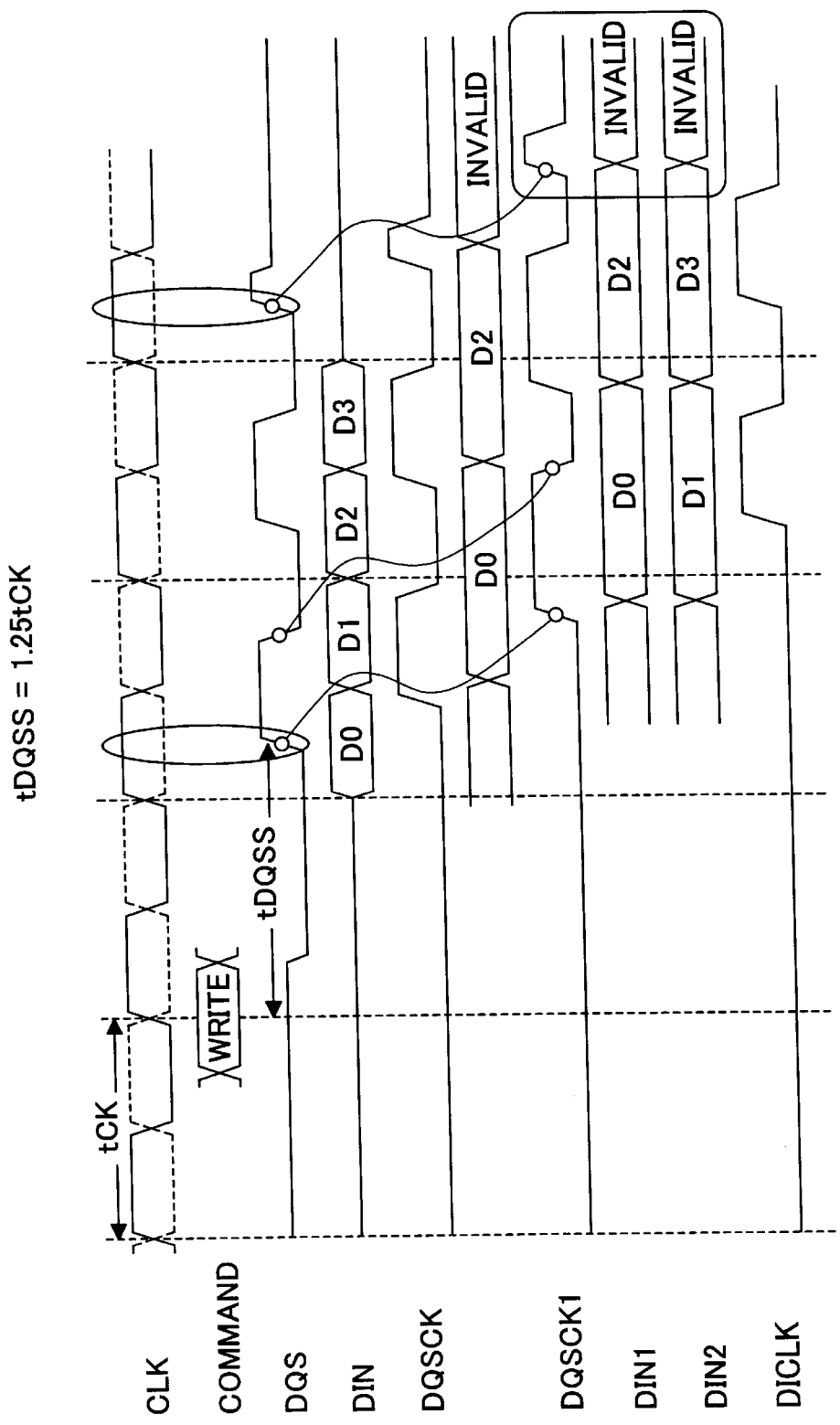
FIG. 3 is a timing chart for explaining another example of the operation of the data input circuit.

FIG. 3 is a timing chart for explaining another example of the operation of the data input circuit. The chart shows the operation that takes place when the length of time tDQSS from the command input until the inputting of the first data strobe signal DQS is at the permissible maximum of 1.25 tCK. When the data strobe signal DQS is inputted behind the clock signal CLK, as the clock signal CLK is at its high level, the clock signal DQSCK1 is generated correspondingly to the data strobe signal DQS.

For this reason, in a state wherein the flip-flop circuit FF2 has taken in the sets of data D2 and D3 in response to the variation of the clock signal DQSCK1 from the high level to the low level, the clock signal DQSCK1 varies from the low level to the high level to take them in. In other words, as the data strobe signal DQS returns to a high impedance after the sets of data D2 and D3 are transferred to the flip-flop circuit FF3, the occurrence of any noise known as glitch would pose no problem even if the glitch extinguishes the sets of data D2 and D3 held by the flip-flop circuit FF2, because valid data are already transferred to the flip-flop circuit FF3.

Figure 4:
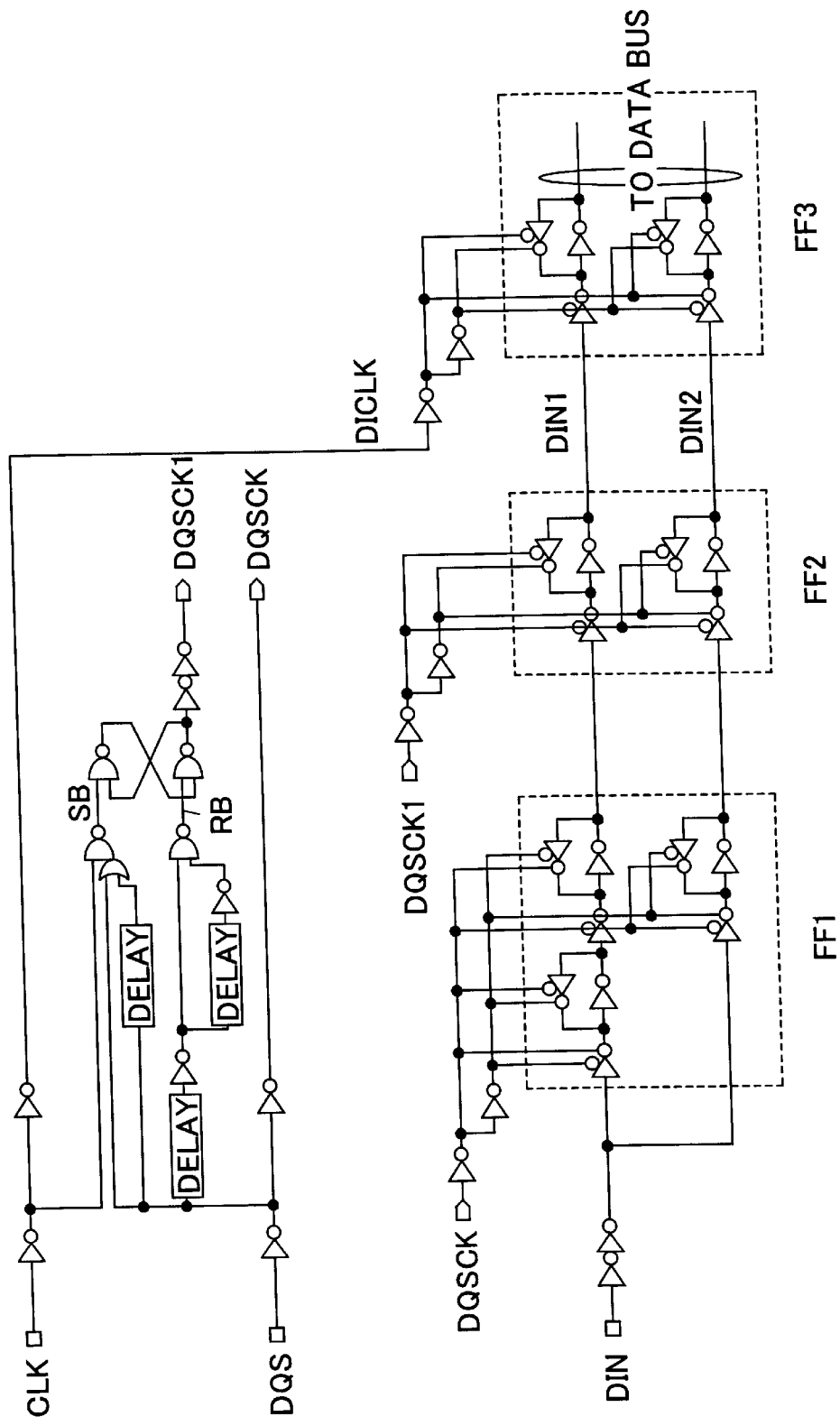
FIG. 4 is a circuit diagram illustrating a data input circuit and its clock generating circuit in another embodiment of the invention.

FIG. 4 is a circuit diagram illustrating a data input circuit and its clock generating circuit in another embodiment of the present invention. This embodiment is basically similar to that illustrated in FIG. 1. Inverted signals are used as input signals to the clock generating circuit. Thus, as the clock signal CLK and the data strobe signal DQS, signals inverted by the output signal of one of the inverter circuits constituting the input buffer are inputted to the clock generating circuit. Further by causing the output signal of the set/reset flip-flop circuit to be supplied through two inverter circuits, the logical level is made the same as that in the embodiment shown in FIG. 1. Thus, even though the logical level is inverted, similar operations can be performed.

Figure 5:
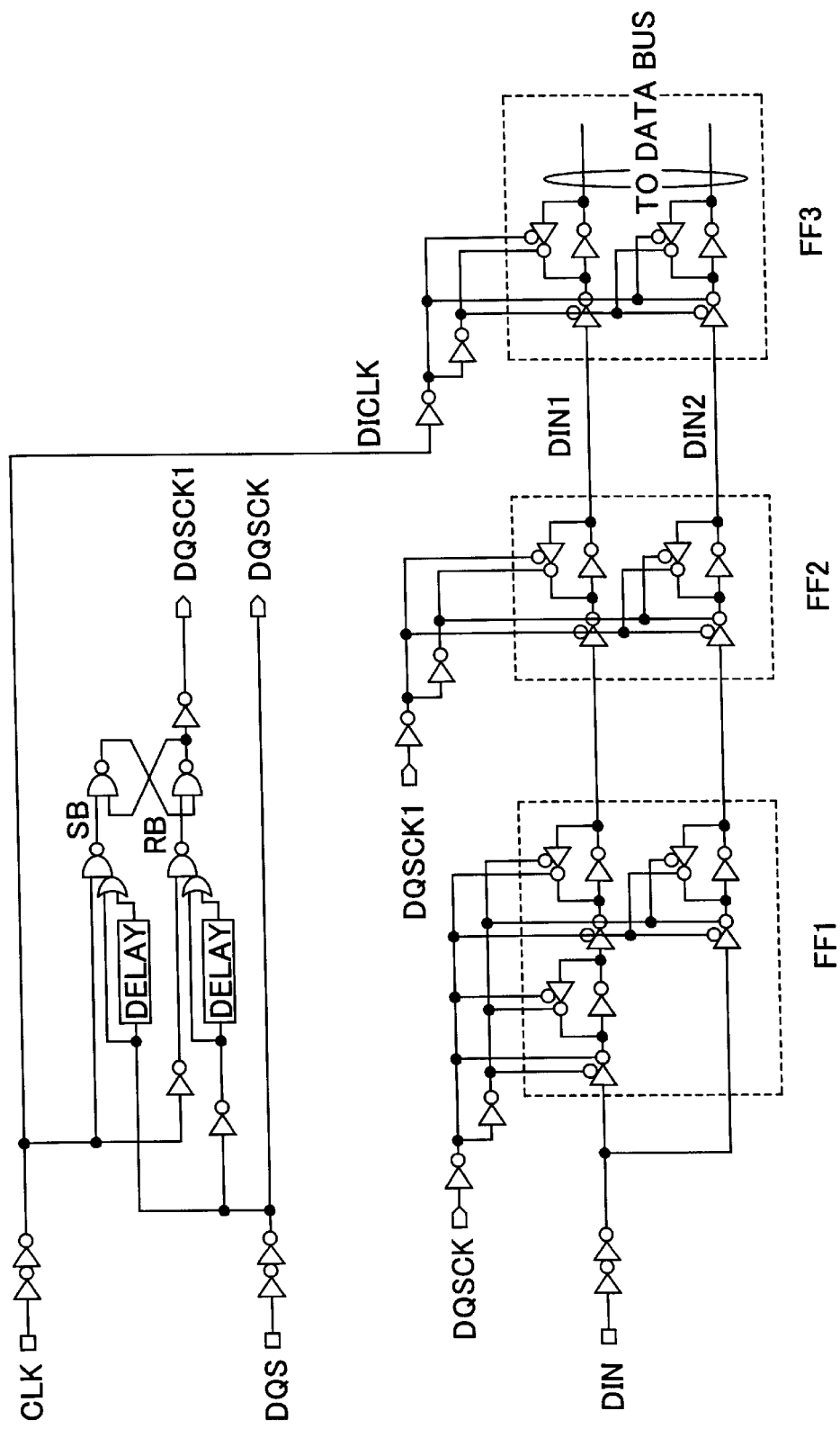
FIG. 5 is a circuit diagram illustrating a data input circuit and its clock generating circuit in still another embodiment of the invention.

FIG. 5 is a circuit diagram illustrating a data input circuit and its clock generating circuit in still another embodiment of the present invention. This embodiment is basically similar to that illustrated in FIG. 1 except that the logical conditions of the clock signal CLK are added to both the set input SB and the reset input RB. Thus the set input SB is generated at the timing of the rise to the high level of either the clock signal CLK or the data strobe signal DQS, whichever is the later, as in the described case, and similarly the reset signal RB is also is generated at the timing of the drop to the low level of either the clock signal CLK or the data strobe signal DQS, whichever is the later. This facilitates distribution of the pulse duty of the clock signal DQSCK1.

Thus the duty of the clock signal DQSCK1 is equalized to the duty of the clock signal CLK or the data strobe signal DQS, whichever is delayed in timing. As a result, the duty of the clock signal DQSCK1 is approximately 0.5 tCK, which means no risk for the pulse to be collapsed and greater ease of distribution.

Figure 6:
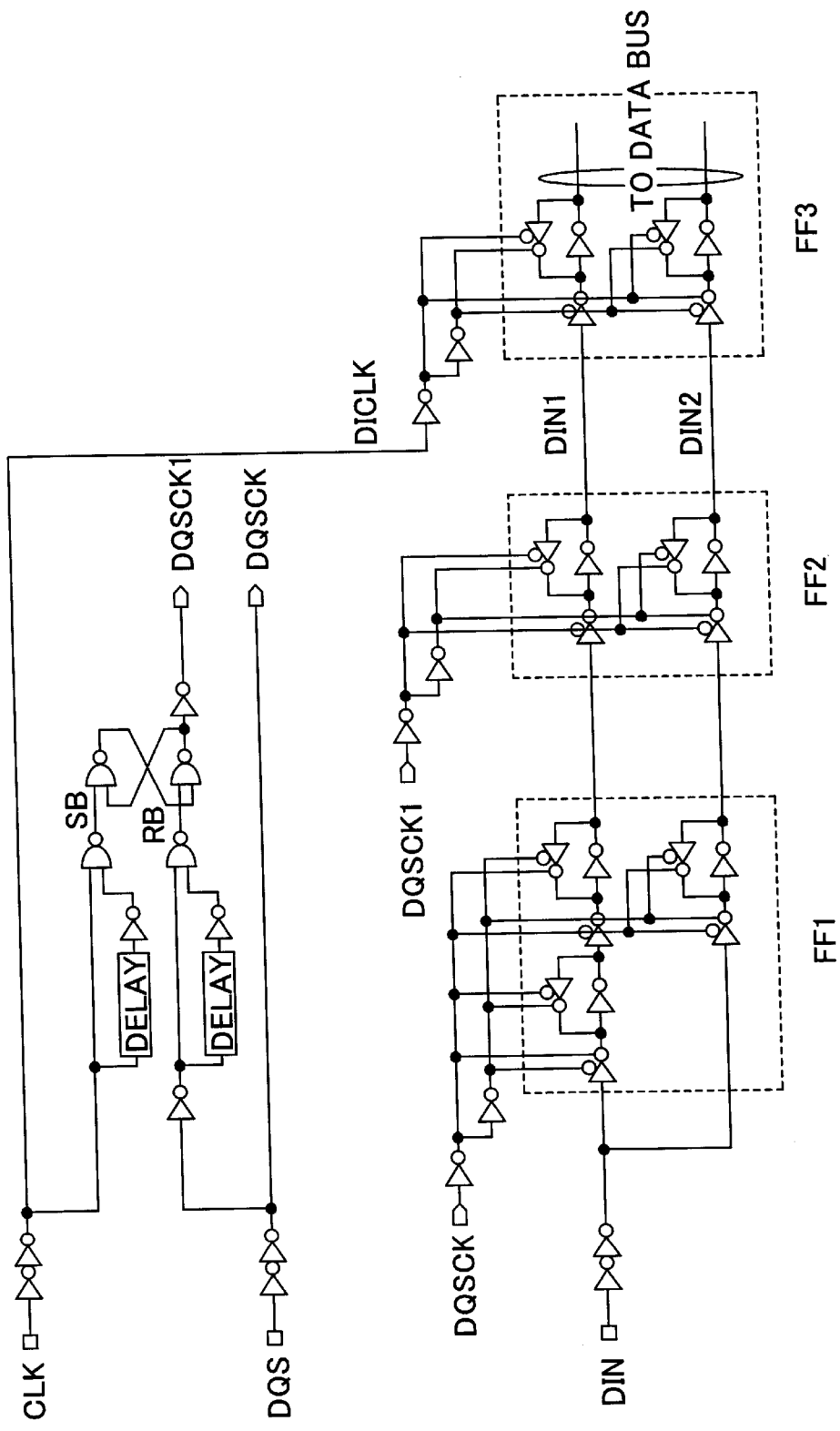
FIG. 6 is a circuit diagram illustrating a data input circuit and its clock generating circuit in yet another embodiment of the invention.

FIG. 6 is a circuit diagram illustrating a data input circuit and its clock generating circuit in yet another embodiment of the invention. This embodiment is basically similar to that illustrated in FIG. 1 except that, in the clock generating circuit, the set input SB is generated at the timing of the variation of the clock signal CLK from the low level to the high level and the reset input SB is generated at the timing of the variation of the data strobe signal DQS from the high level to the low level. The phasic relationship between the clock signal CLK and the data strobe signal DQS is such that, as shown in FIG. 8, the data strobe signal DQS is generated to have a pulse width of 0.5 tCK, as tDQSS is from 0.75 tCK to 1.25 tCK, and accordingly even a simple logic circuit like the one in this embodiment can substantially eliminate glitch.

To express it in another way, the phasic relationship between the clock signal CLK and the data strobe signal DQS is specified to be represented by tDQSS=0.75 tCK to 1.25 tCK as stated above, the clock signal CLK and the data strobe signal DQS are generated to have a pulse width of 0.5 tCK each, the interval from the falling edge of the data strobe signal DQS to the rising edge of the clock signal CLK the timing of the variation of the (the falling edge of /CLK) is about 0.25 tCK at least. Therefore, if the time lag of delaying by the signal bus between the clock signal CLK and the data strobe signal DQS is sufficiently small, normal operation is possible even if no logical relationship is established between the setting side clock signal CLK of the latch circuit generating the clock signal DQSCK1 and the data strobe signal DQS. Thus even a simple logic circuit like the one in this embodiment, like the above-described circuit, can substantially clear the data strobe signal DQS of glitch.

Typical advantages derived from the foregoing embodiments of the present invention are summarized below.

(1) There is provided an input circuit which, using a second clock signal inputted when in write operation, successively takes a plurality of sets of write data serially input in response to that clock signal into a plurality of first latch circuits, and takes the write data written into the first latch circuits using a first clock signal into the second latch circuit to convey them to an input/output data bus; there is further provided a logic circuit for providing a mask, according to the logic of the first clock signal and the second clock signal, against noise arising at the time the second clock signal ends to generate a third clock signal; by supplying it to the first latch circuits outputting the write data to at least the input of the second latch circuit, any particular measure to prevent the aforementioned noise generation can be dispensed with in the output circuit for generating the second clock signal, resulting in the advantage of increasing the convenience of use as well as the aforementioned noise immunity.

(2) In addition to the above, the external terminal to which the second clock signal is inputted is commonly used as the input terminal of the input circuit to which the clock signal is to be taken in and as the output terminal of the output circuit having a three-way output function for outputting the clock signal generated by the internal clock generating circuit in response to the first clock signal when in read operation, and is placed in a high impedance state except when in write and read operation, resulting in the advantage of making possible fast and steady accomplishment of data inputting/outputting with a small number of external terminals.

(3) In addition to the above, by configuring the first latch circuits of one of first latch circuits for serially transferring the write data inputted in synchronism with the rising edge of the second clock signal and another of first latch circuits for serially transferring the write data inputted in synchronism with the falling edge of the second clock signal to convert the serial data into parallel data, and providing a pair of latch circuits matching the two first latch circuits, there is provided the advantage of enabling data to be inputted twice as fast as the write cycle.

(4) In addition to the above, by using as the logic circuit a flip-flop circuit which is set in response to a variation in whichever or the first clock signal or the second clock signal comes earlier in timing and is reset in response to a variation in whichever of the clock signals comes later in timing, and generating the third clock signal according to the set/reset operation of the flip-flop circuit, there is achieved the advantage that any noise arising in the second clock can be substantially eliminated with a simple configuration.

(5) In addition to the above, by using as the logic circuit a flip-flop circuit which is set at the timing of the variation of the first clock signal from one level to the other and is reset at the timing of the variation of the second clock signal from one level to the other, and generating the third clock signal by the set/reset operation of the flip-flop circuit, there is achieved the advantage that any noise arising in the second clock can be substantially eliminated with a simple configuration.

(6) By using as the aforementioned dynamic type RAM a synchronous DRAM of a DDR configuration, there is achieve the advantage that the timing specification regarding the data strobe signal DQS can be satisfied and, moreover, glitch immunity at the time of the end of write data inputting can be enhanced.

While the invention by the present inventors have been described so far in specific terms with reference to preferred embodiments thereof, the present invention is not confined to the foregoing embodiments, but obviously various modifications are possible within the spirit and scope of the invention. For instance, the memory section may be a static type RAM instead of a dynamic type RAM. In other words, the invention can be similarly applied also to a static type RAM wherein data inputting and outputting are accomplished in a DDR configuration. The logic circuit for masking any noise that may arise at the end of the data strobe signal DQS may be a gate circuit which can mask such noise, instead of a set/reset flip-flop circuit.

A semiconductor memory device according to the present invention can be extensively utilized for various semiconductor devices to which data are entered according to the DDR standards in addition to the aforementioned synchronous DRAM of a DDR configuration.

Besides that, the invention can be utilized for various semiconductor memory devices the data inputting to which is controlled by using a clock signal for controlling the operational timings in general and a data strobe signal which enters into a high impedance state while standing by. Furthermore, the invention can be extensively utilized for a variety of semiconductor devices the data inputting to which is controlled, not confined to semiconductor memory devices.

What is claimed is:

1. A semiconductor device, comprising:

a plurality of memory cells; and a control circuit which controls the timing to write data into one of the said memory cells;

wherein a clock signal and a data strobe signal are fed into said control circuit to control said timing, wherein said control circuit comprises a sequential logic circuit, and wherein said clock signal and said data strobe signal are fed into said sequential logic circuit and the output of the sequential logic circuit is fed into a logic circuit which receives said write data.

2. The semiconductor device according to claim 1, wherein said sequential logic circuit is a set/reset flip-flop circuit, and wherein said memory cells are DRAM cells.

* * * * *